(12) United States Patent
Mao et al.

(10) Patent No.: US 8,436,432 B2
(45) Date of Patent: May 7, 2013

(54) RF MEMS SWITCH AND FABRICATING METHOD THEREOF

(75) Inventors: Jun-Kai Mao, Tainan (TW); Chiung-l Lee, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 15 days.

(21) Appl. No.: 13/049,864

(22) Filed: Mar. 16, 2011

(65) Prior Publication Data
US 2012/0168883 A1  Jul. 5, 2012

(30) Foreign Application Priority Data

Dec. 30, 2010  (TW) ................................. 99146770 A (51) Int. Cl.
*B81B 3/00* (2006.01)
(52) U.S. Cl.
USPC ............................................ 257/415; 438/52
(58) Field of Classification Search .................. 257/415, 257/416, E21.001, E29.324; 310/300, 328; 318/316; 438/50
See application file for complete search history.

(56) References Cited

U.S. PATENT DOCUMENTS

| | | | |
|---|---|---|---|
| 6,396,368 B1 | 5/2002 | Chow et al. | |
| 6,452,124 B1 | 9/2002 | York et al. | |
| 6,667,245 B2 | 12/2003 | Chow et al. | |
| 2003/0006858 A1* | 1/2003 | Ma | 333/101 |
| 2009/0003039 A1* | 1/2009 | Naito | 365/151 |
| 2010/0207217 A1* | 8/2010 | Zuniga-Ortiz et al. | 257/415 |

OTHER PUBLICATIONS

Dai et al, "Design and Fabrication of RF MEMS Switch by the CMOS Process", Tamkang Journal of Science and Engineering frequency, Nov. 3, 2005, 197-202.
Tang et al., "High isolation X-band MEMS capacitive switches", Sensors and Actuators, Oct. 7, 2004, 241-248.
Goldsmith et al., "Charging Characteristics of Ultra-Nano-Crystalline Diamond in RF MEMS Capacitive Switches", Microwave Symposium Design (MTT), 2010 IEEE MTT-S, May 3, 2010, 1246-1249.

* cited by examiner

*Primary Examiner* — Olik Chaudhuri
*Assistant Examiner* — Wilner Jean Baptiste
(74) *Attorney, Agent, or Firm* — Jianq Chyun IP Office (57) ABSTRACT

A RF MEMS switch includes a substrate, a first electrode, a first insulating layer, a second insulating layer, a second electrode and a movable electrode. The first electrode is disposed on the substrate. The first insulating layer covers the first electrode. The second insulating layer covers a portion of the substrate. The second electrode is disposed in the second insulating layer and is located at a plane different from a plane of the first electrode. The movable electrode is partially disposed on a surface of the second insulating layer, and extends over the first electrode and the second electrode. A portion of the movable electrode not disposed on the surface of the second insulating layer is a movable portion. The second insulating layer has a gap exposing a space between the movable portion and the first insulating layer and a space between the movable portion and the second electrode.

14 Claims, 6 Drawing Sheets

RF MEMS SWITCH AND FABRICATING METHOD THEREOF

CROSS-REFERENCE TO RELATED APPLICATION

This application claims the priority benefit of Taiwan application serial no. 99146770, filed Dec. 30, 2010. The entirety of the above-mentioned patent application is hereby incorporated by reference herein and made a part of this specification.

TECHNICAL FIELD

The invention relates to a microelectromechanical system (MEMS) structure and a fabricating method thereof, in particular to a radio frequency (RF) MEMS switch and a fabricating method thereof.

BACKGROUND

With the development of economic globalization and the demands for mobile, wireless and multimedia communications, all kinds of wireless communication have been developed vigorously. Currently, seven or more standards or frequency bands are applied in the wireless communications, and each standard has unique characteristics and restrictions; however, after entering into the 4 G standard in 2010 and the 5 G standard in 2020 in future, the development of the broadband communication technology is in a trend of making full use of the undeveloped or less applied frequency resources (such as the operating frequency band of 2.4 G, 3.5 G, 5.7 G, 26 G, 30 G, 38 G or even 60 G) to realize a high access rate.

The conventional electronic elements are big and have high insertion loss and consumption power, so these electronic elements are certainly hard to meet the future demands for high-frequency elements. As compared with the prior art, regarding the RF frequency band, only the MEMS element can provide sufficient isolation and very low insertion loss. In order to satisfy the operating frequency and power loss requirements of future wireless communication systems, the "light, thin, short and small" and low-loss MEMS element may be fabricated through the MEMS technology.

A greater frequency spectrum utilization rate may be realized by integrating the advanced technologies in the field of microwave and wired communications. Therefore, the microwave switch fabricated through the MEMS process is one of the critical technologies of the practicability of 4 G and 5 G. However, it is the challenge for us today to integrate the frequency bands so as to achieve more flexible bandwidth distribution.

SUMMARY

Accordingly, a radio frequency (RF) microelectromechanical system (MEMS) switch having a multi-stage capacitance variation is introduced herein.

The disclosure provides an RF MEMS switch, which includes a substrate, a first electrode, a first insulating layer, a second insulating layer, a second electrode and a movable electrode. The first electrode is disposed on the substrate. The first insulating layer covers the first electrode. The second insulating layer covers a portion of the substrate. The second electrode is disposed in the second insulating layer and is located at a plane different from a plane of the first electrode. The movable electrode is partially disposed on a surface of the second insulating layer, and extends over the first electrode and the second electrode. A portion of the movable electrode not disposed on the surface of the second insulating layer is a movable portion. The second insulating layer has a gap, and the gap exposes a space between the movable portion and the first insulating layer and a space between the movable portion and the second electrode.

The disclosure provides a fabricating method of an RF MEMS switch, which includes the following steps. A first electrode is formed on a substrate. A first insulating layer that covers the first electrode is formed on the first electrode. A barrier layer is formed on the first insulating layer. A second insulating layer is formed on the barrier layer. A second electrode is formed in the second insulating layer. A movable electrode is formed above the first electrode and the second electrode. A portion of the second insulating layer is removed by using the barrier layer as a mask to make a portion of the movable electrode not located on a surface of the second insulating layer, so as to form a gap in the second insulating layer and form a movable portion, wherein the gap exposes a space between the movable portion and the barrier layer and a space between the movable portion and the second electrode.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

FIGS. 1A to 1D are cross-sectional diagrams illustrating a fabricating flow of an RF MEMS switch according to an exemplary embodiment. FIGS. 1E and 1F are schematic diagrams illustrating an actuation manner of an RF MEMS switch according to an exemplary embodiment.

Figure 1A:
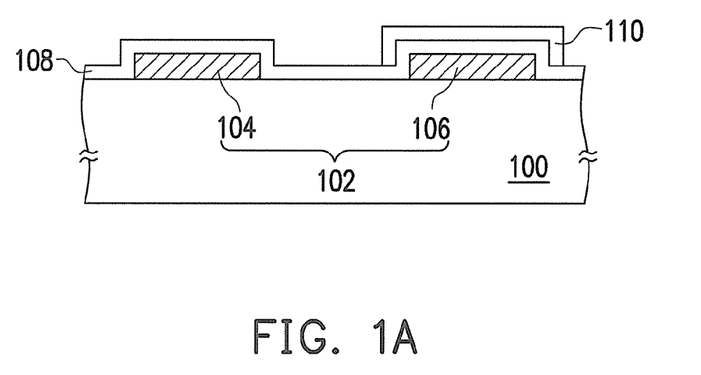
FIGS. 1A to 1D are cross-sectional diagrams illustrating a fabricating flow of an RF MEMS switch according to an exemplary embodiment.

Referring to FIG. 1A, firstly, a conductor layer 102 is formed on a substrate 100. The conductor layer 102 includes an electrode 104 and an electrode 106, in which the electrode 104 and the electrode 106 may respectively serve as a grounding electrode and a drive electrode. The substrate 100 is, for example, an Si substrate. A material of the conductor layer 102 is, for example, doped polysilicon. A forming method of the conductor layer 102 includes, for example, forming a conductor material layer (not shown) on the substrate 100 through chemical vapor deposition (CVD) and then performing a patterning process on the conductor material layer.

Then, an insulating material layer 108 is formed on the substrate 100 and covers the electrode 104 and the electrode 106. The material of the insulating material layer 108 is, for example, high-temperature oxide. The forming method of the insulating material layer 108 is, for example, chemical vapor deposition.

Afterwards, a barrier layer 110 is formed on the insulating material layer 108. The material of the barrier layer 110 is, for example, polysilicon. The forming method of the barrier layer 110 includes, for example, forming a barrier material layer (not shown) on the insulating material layer 108 through the chemical vapor deposition and then performing a patterning process on the barrier material layer.

Figure 1B:
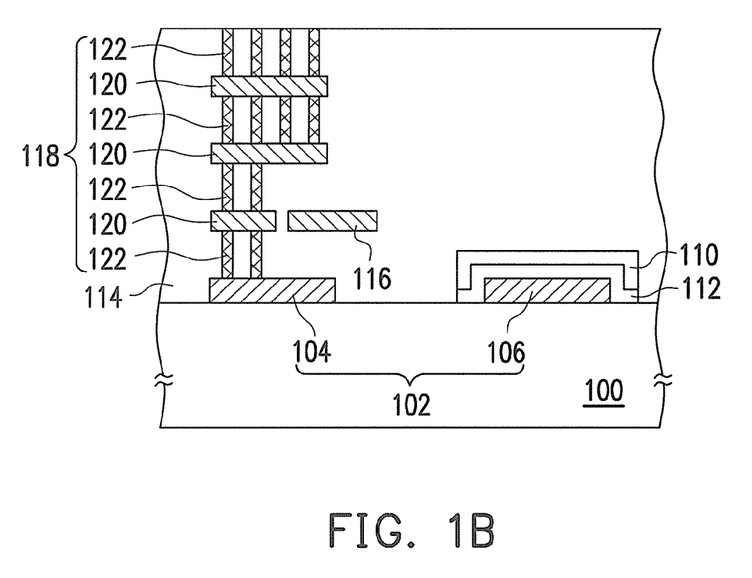

After that, referring to FIG. 1B, the barrier layer 110 is used as a mask to remove portion of the insulating material layer 108 which is not covered by the barrier layer 110. Then an insulating layer 112 that covers the electrode 106 is formed on the electrode 106. A thickness of the insulating layer 112 is, for example, 30 nm to 40 nm. A method of removing the insulating material layer 108 not covered by the barrier layer 110 is, for example, dry etching. In this embodiment, the barrier layer 110 and the insulating layer 112 are formed through the above method, which is not intended to limit the scope of the disclosure.

Thereafter, an insulating layer 114 is formed on the electrode 104 and the barrier layer 110. In this embodiment, for simplification, the insulating layer 114 is shown as a single layer, which is not intended to limit the scope of the disclosure. In practice, the insulating layer 114 may be a single-layered structure or a multi-layered structure, which is determined by the product design. The material of the insulating layer 114 is, for example, a dielectric material such as silicon oxide.

After that, an electrode 116 is formed in the insulating layer 114 and may serve as a drive electrode. The material of the electrode 116 is, for example, a metal such as copper. At the same time, an interconnect structure 118 may be optionally formed in the insulating layer 114, and the interconnect structure 118 may include any number of the metal layers 120 and a plurality of vias 122 to connect the electrode 104 to a surface of the insulating layer 114. The interconnect structure 118 is not electrically connected to the electrode 116. The material of the metal layers 120 is, for example, a metal such as copper. The material of the vias 122 is, for example, a metal such as tungsten.

Figure 1C:
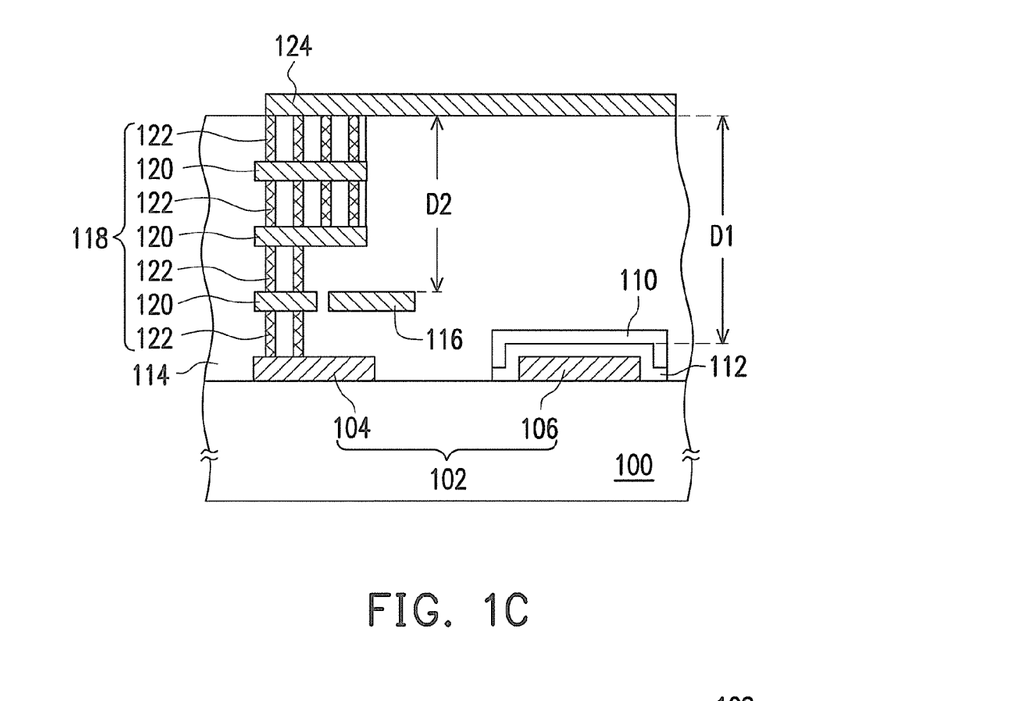

Furthermore, referring to FIG. 1C, a conducting element 124 is formed on the surface of the insulating layer 114 to serve as a movable electrode and is electrically connected to the interconnect structure 118. The material of the conducting element 124 is, for example, a metal such as copper. In this embodiment, the movable electrode is the conducting element 124 for illustration, which is not intended to limit the scope of the disclosure.

Figure 1D:
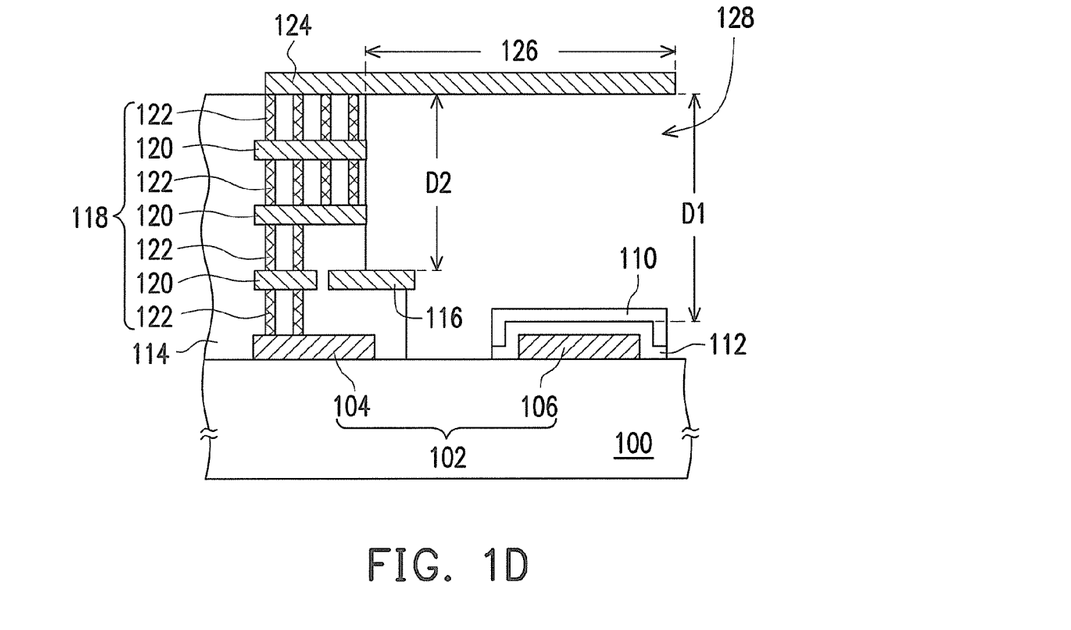
Figure 1E:
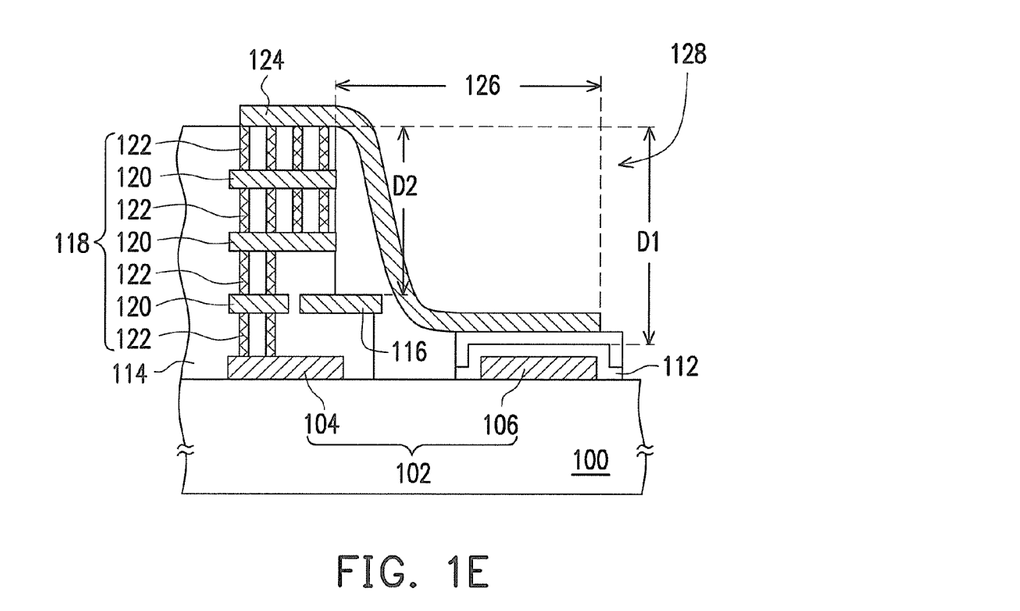
FIGS. 1E and 1F are schematic diagrams illustrating an actuation manner of an RF MEMS switch according to an exemplary embodiment.
Figure 1F:
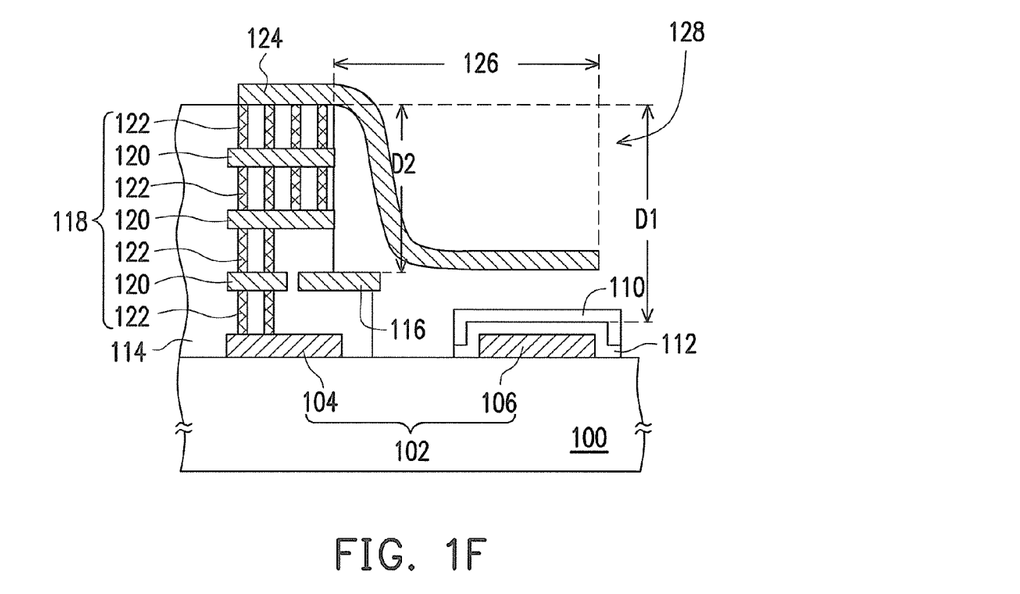

Afterwards, as shown in FIG. 1D, a gap 128 is formed between the conducting element 124 and the insulating layer 114 by using the barrier layer 110 as the mask to remove a portion of the insulating layer 114. A portion of the conducting element 124 is adjacent to the gap 128 (that is, not attached to the insulating layer 114) may be a movable portion 126 of the movable electrode. The gap 128 exposes a space between the movable portion 126 and the barrier layer 110 and a space between the movable portion 126 and the electrode 116. A length of the movable portion 126 is, for example, 300 µm to 310 µm. A distance D1 between the movable portion 126 and the insulating layer 112 is, for example, 5.5 µm to 6.5 µm. A distance D2 between the movable portion 126 and the electrode 116 is, for example, 4.0 µm to 4.5 µm.

Besides, after the gap 128 is formed, the barrier layer 110 may further be optionally removed to expose a space between the movable electrode and the insulating layer 112. In the step of removing the barrier layer 110, the insulating layer 112 is used as the mask to protect the electrode 106 located under the insulating layer 112, so as to improve the reliability of the process. The removing method of the barrier layer 110 is, for example, dry etching or wet etching.

Furthermore, the RF MEMS switch of the above embodiment may be fabricated through a complementary metal oxide semiconductor (CMOS) process. When the RF MEMS switch of the above embodiment is fabricated through the complementary metal oxide semiconductor process, the RF MEMS switch may be integrated with a circuit on a single chip (that is, a System On Chip (SOC)).

Based on the above embodiment, when the gap 128 is formed in the insulating layer 114, the barrier layer 110 is used as the mask to protect the insulating layer 112, thereby increasing the time margin of the etching process. Therefore, the fabricating method of an RF MEMS switch of the above embodiment can greatly improve the process yield and reduce cost in addition to removing a portion of the insulating layer 114 in the absence of the time control.

Hereinafter, the actuation manner of the RF MEMS switch 10 is described in the embodiments of FIGS. 1E and 1F. Referring to FIG. 1E, the RF MEMS switch 10 includes a substrate 100, an electrode 104, an electrode 106, an insulating layer 112, an insulating layer 114, an electrode 116, an interconnect structure 118 and a conducting element 124. The material, composition and forming method of all elements and the arrangement relations of all the elements have been described in detail in the above embodiment, so the details will not be described herein again. When the electrode 104 serves as the grounding electrode and the electrode 106 serves as the drive electrode, a bias is applied to the electrode 106, the movable portion 126 may move towards the electrode 106 under the action of electrostatic force, but as isolated by the insulating layer 112, the movable portion 126 is not electrically connected to the electrode 106, thereby generating a capacitor.

Referring to FIG. 1F, when the electrode 104 serves as the grounding electrode and the electrode 116 serves as the drive electrode, a bias is applied to the electrode 116, and the movable portion 126 may move towards the electrode 116 under the action of the electrostatic force, thereby generating a capacitor.

Based on the above embodiment, as the electrode 104 coupled to a movable electrode (the conducting element 124) may serve as the grounding electrode and both the electrode 106 and the electrode 116 may serve as the drive electrode, when different drive electrodes are selected to act with the grounding electrode, the electrode 106 and the electrode 116 may respectively form different capacitor switches with the movable electrode (the conducting element 124). Therefore, the RF MEMS switch of this embodiment has a high capacitance ratio and may perform a multi-stage capacitance switching.

FIGS. 2A to 2D are cross-sectional diagrams illustrating a fabricating flow of an RF MEMS switch according to another exemplary embodiment.

Figure 2A:
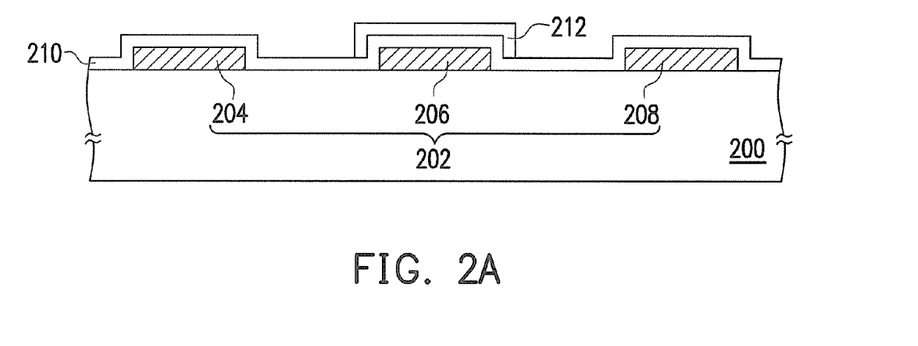
FIGS. 2A to 2D are cross-sectional diagrams illustrating a fabricating flow of an RF MEMS switch according to another exemplary embodiment.

Referring to FIG. 2A, firstly, a conductor layer 202 is formed on a substrate 200. The conductor layer 202 includes an electrode 204, an electrode 206 and an electrode 208, in which the electrode 206 is disposed between the electrode 204 and the electrode 208. The electrode 204 and the electrode 208 may be respectively connected to a ground line to serve as the grounding electrode, and the electrode 206 may be a drive electrode. The substrate 200 is, for example, a Si substrate. The material of the conductor layer 202 is, for example, doped polysilicon. The forming method of the conductor layer 202 includes, for example, forming a conductor material layer (not shown) on the substrate 200 through the chemical vapor deposition and then performing a patterning process on the conductor material layer.

Then, an insulating material layer 210 is formed on the substrate 200 and covers the electrode 204, the electrode 206 and the electrode 208. The material of the insulating material layer 210 is, for example, a high-temperature oxide. The forming method of the insulating material layer 210 is, for example, the chemical vapor deposition.

Afterwards, a barrier layer 212 is formed on the insulating material layer 210. The material of the barrier layer 212 is, for example, polysilicon. The forming method of the barrier layer 212 includes, for example, forming a barrier material layer (not shown) on the insulating material layer 210 through the chemical vapor deposition and then performing a patterning process on the barrier material layer.

Figure 2B:
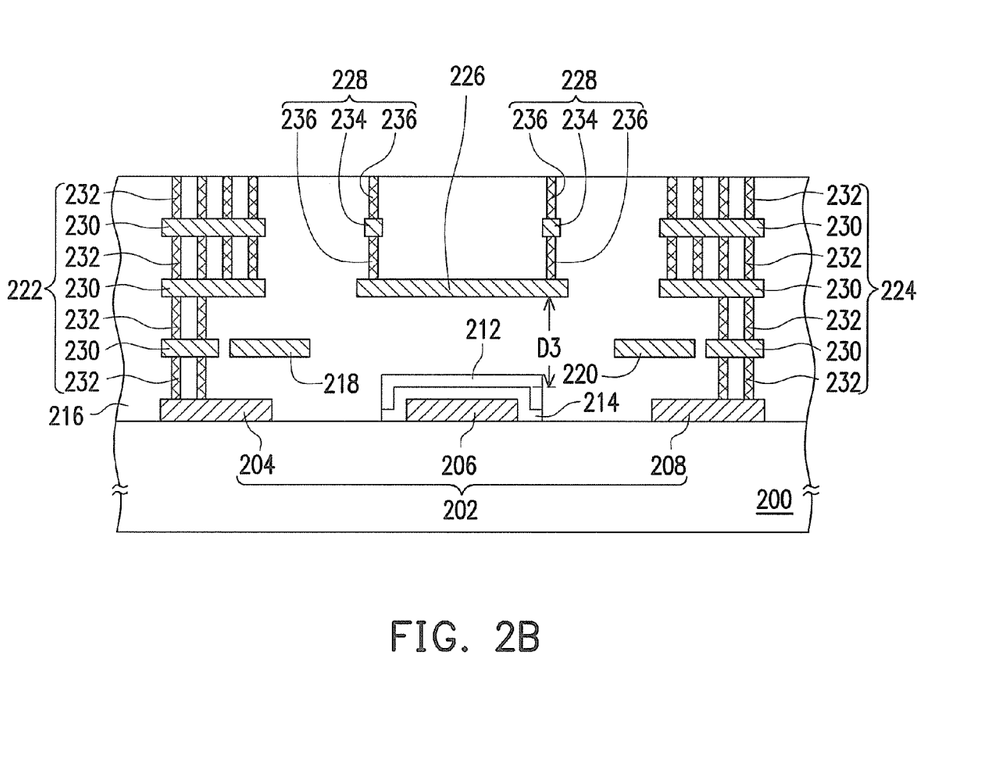

Then, referring to FIG. 2B, an insulating layer 214 that covers the electrode 206 is formed on the electrode 206 by using the barrier layer 212 as a mask to remove the insulating material layer 210 which is not covered by the barrier layer 212. The thickness of the insulating layer 214 is, for example, 30 nm to 40 nm. The method of removing the insulating material layer 210 not covered by the barrier layer 212 is, for example, the dry etching. In this embodiment, the barrier layer 212 and the insulating layer 214 are formed through the above method, which is not intended to limit the scope of the disclosure.

Hereinafter, an insulating layer 216 is formed on the electrode 204 and the barrier layer 212. In this embodiment, for simplification, the insulating layer 216 is shown as a single layer, which is not intended to limit the scope of the disclosure. In practice, the insulating layer 216 may be a single-layered structure or a multi-layered structure, which is determined by the product design. The material of the insulating layer 216 is, for example, a dielectric material such as silicon oxide.

After that, an electrode 218 and an electrode 220 are formed in the insulating layer 216 and may respectively be a drive electrode. The material of the electrode 218 and the electrode 220 may be, for example, a metal such as copper. The electrode 218 and the electrode 220 may be applied with the same driving voltage or different driving voltages.

Then, an interconnect structure 222, an interconnect structure 224, a bridge metal layer 226 and connecting wires 228 are formed in the insulating layer 216. The interconnect structure 222 is coupled to the electrode 204, the interconnect structure 224 is coupled to the electrode 206 and the bridge metal layer 226 is coupled to the connecting wires 228. Both the interconnect structure 222 and the interconnect structure 224 include any number of the metal layers 230 and a plurality of vias 232. The metal layers 230 are independent metal layers and may be coupled to each other through the vias 232. The material of the metal layer 230 is, for example, a metal such as copper. The material of the vias 232 is, for example, a metal such as tungsten. The bridge metal layer 226 is disposed above the electrode 206. The material of the bridge metal layer 226 is, for example, a metal such as copper. A distance D3 between the bridge metal layer 226 and the insulating layer 214 is, for example, 2.8 µm to 3.0 µm. In this embodiment, each of the connecting wire 228 may include a metal layer 234 and a plurality of vias 236, which is not intended to limit the scope of the disclosure. It is known to those of ordinary skill that the number of the metal layers 234 and the vias 236 may be adjusted according to the product design. The material of the metal layers 234 is, for example, a metal such as copper. The material of the vias 236 is, for example, a metal such as tungsten.

Figure 2C:
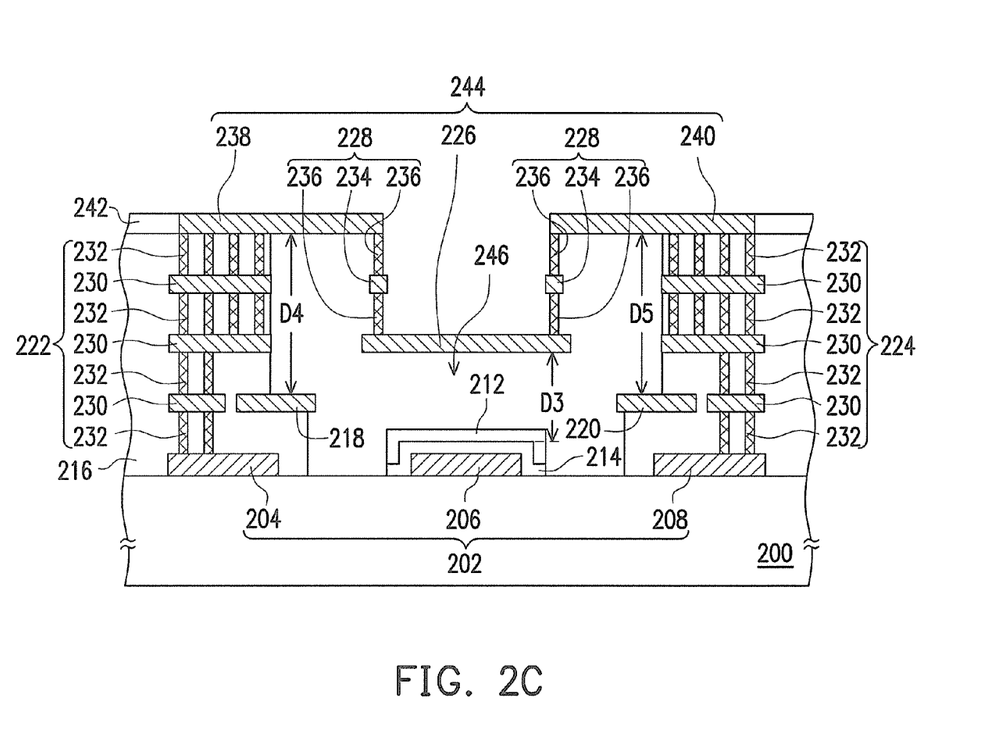

Furthermore, referring to FIG. 2C, a conducting element 238 and a conducting element 240 are formed on the surface of the insulating layer 216. The conducting element 238 is coupled to the interconnect structure 222, the conducting element 240 is coupled to the interconnect structure 224 and the conducting element 238 and the conducting element 240 are respectively coupled to the bridge metal layer 226 through the connecting wires 228. A distance D4 between the conducting element 238 and the electrode 218 is, for example, 4.0 µm to 4.5 µm. A distance D5 between the conducting element 240 and the electrode 220 is, for example, 4.0 µm to 4.5 µm. The material of the conducting element 238 and the conducting element 240 is, for example, a metal such as copper respectively. In this embodiment, a movable electrode 244 may include a bridge metal layer 226, connecting wires 228, a conducting element 238 and a conducting element 240, which is not intended to limit the scope of the disclosure.

After that, a portion of the insulating layer 216 is removed by using the barrier layer 212 as a mask, so as to form a gap 246 in the insulating layer 216. The gap 246 exposes a space between the movable electrode 244 (the bridge metal layer 226) and the barrier layer 212, a space between the movable electrode 244 (the conducting element 238) and the electrode 218 and a space between the movable electrode 244 (the conducting element 240) and the electrode 220.

Figure 2D:
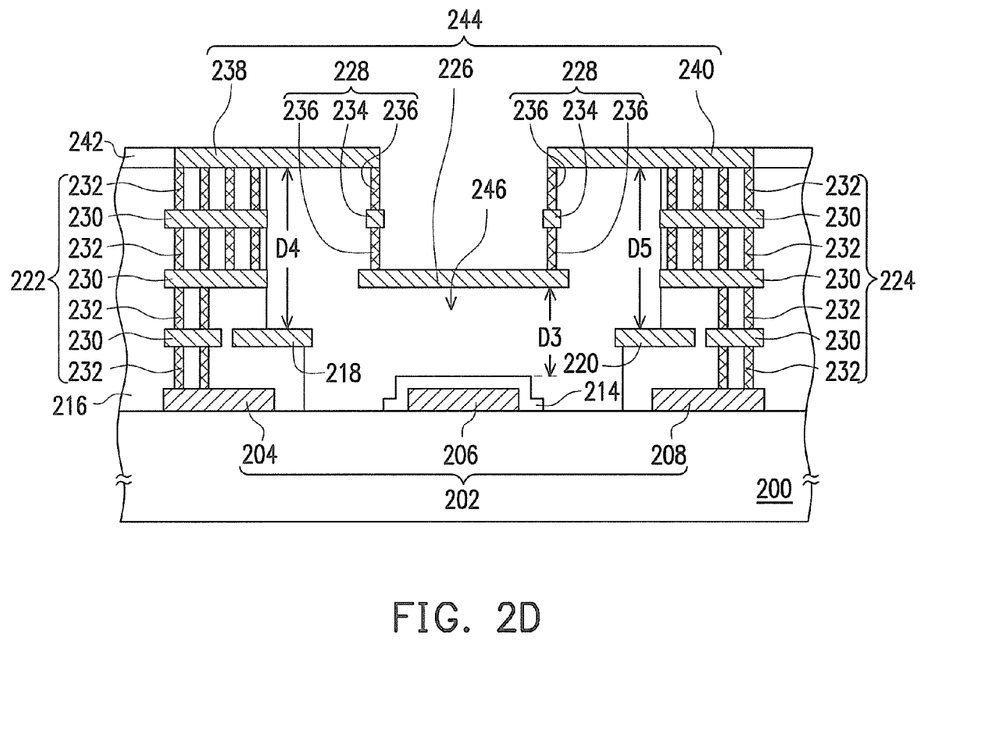

Then, referring to FIG. 2D, the barrier layer 212 may be optionally removed after the gap 246 is formed, so as to expose a space between the movable electrode (the bridge metal layer 226) and the insulating layer 214. In the step of removing the barrier layer 212, the insulating layer 214 is used as the mask to protect the electrode 206 located under the insulating layer 214, thereby improving the reliability of the process. The removing method of the barrier layer 212 is, for example, the dry etching or the wet etching.

Furthermore, the RF MEMS switch of the above embodiment may be fabricated through a complementary metal oxide semiconductor process. When the RF MEMS switch of the above embodiment is fabricated through the complementary metal oxide semiconductor process, the RF MEMS switch may be integrated with a circuit on a single chip.

Based on the above embodiment, when the gap 246 is formed in the insulating layer 216, the barrier layer 212 is used as the mask to protect the insulating layer 214, thereby increasing the time margin of the etching process. Therefore, the fabricating method of an RF MEMS switch of the above embodiment can greatly improve the process yield and reduce cost in addition to removing a portion of the insulating layer 216 in the absence of the time control.

The actuation manner of an RF MEMS switch 20 is described below in the embodiment of FIG. 2D. The RF MEMS switch 20 includes a substrate 200, an electrode 204, an electrode 206, an insulating layer 214, an electrode 218, an electrode 208, an electrode 220, an interconnect structure 222, an interconnect structure 224 and a movable electrode 244. The movable electrode 244 may include a bridge metal layer 226, connecting wires 228, a conducting element 238 and a conducting element 240. The material, composition and forming method of all the elements and the arrangement relations of all the elements are described in detail in the above embodiment, so the details will not be described herein again. When the electrode 204 and the electrode 208 serve as the grounding electrodes and the electrode 206 serves as the drive electrode, a bias is applied to the electrode 206, the movable electrode 244 (the bridge metal layer 226) may move towards the electrode 206 under the action of the electrostatic force, but as isolated by the insulating layer 214, the movable electrode 244 is not electrically connected to the electrode 206, thereby generating a capacitor. When the electrode 204 and the electrode 208 serve as the grounding electrodes and the electrode 218 and the electrode 220 serve as the drive electrodes, a bias is applied to the electrode 218 and the electrode 220, the movable electrode 244 (the conducting element 238 and the conducing element 240) may respectively move towards the electrode 218 and the electrode 220 under the action of the electrostatic force, thereby generating a capacitor.

Based on the above embodiment, the electrode 206, the electrode 218 and the electrode 220 may respectively form the capacitor switches with the movable electrode 244. Therefore, the RF MEMS of this embodiment has a high capacitance ratio and may perform a multi-stage capacitance switching.

Based on the above descriptions, the above embodiments at least have the following advantages.

1. The RF MEMS switch of the above embodiments has a high capacitance ratio and may perform the multi-stage capacitance switching.

2. The fabricating method of an RF MEMS switch of the above embodiments may greatly improve the process yield and reduce cost.

3. When the RF MEMS switch of the above embodiments is fabricated through the complementary metal oxide semiconductor process, the RF MEMS switch may be integrated with a circuit on a single chip.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A radio frequency (RF) microelectromechanical system (MEMS) switch, comprising:
    a substrate;
    a first electrode, disposed on the substrate;
    a first insulating layer, covering the first electrode;
    a second insulating layer, covering a portion of the substrate;
    a second electrode, disposed in the second insulating layer and located at a plane different from a plane of the first electrode;
    a fourth electrode, disposed in the second insulating layer, wherein the first electrode is located between the second electrode and the fourth electrode; and
    a movable electrode, partially disposed on a surface of the second insulating layer, and extending over the first electrode and the second electrode, wherein a portion of the movable electrode not disposed on the surface of the second insulating layer is a movable portion,
    wherein the second insulating layer comprises a gap, and the gap exposes a space between the movable portion and the first insulating layer and a space between the movable portion and the second electrode, and
    wherein the movable portion of the movable electrode further comprising:
        a first conducting element, wherein the gap exposes a space between the first conducting element and the second electrode;
        a second conducting element, wherein the gap exposes a space between the second conducting element and the fourth electrode; and
        a bridge metal layer, located above the first electrode and on a plane between the fourth electrode and the second conducting element, and respectively coupled to the second conducting element and the first conducting element.

2. The RF MEMS switch according to claim 1, wherein when a first bias is applied to the first electrode and a second bias is applied to the movable electrode, the movable portion and the first electrode form a first capacitor.

3. The RF MEMS switch according to claim 1, wherein when a third bias is applied to the second electrode and a fourth bias is applied to the movable electrode, the movable portion and the second electrode form a second capacitor.

4. The RF MEMS switch according to claim 1, wherein a length of the movable portion is 300 µm to 310 µm.

5. The RF MEMS switch according to claim 1, wherein a distance between the movable electrode and the first insulating layer is 5.5 µm to 6.5 µm.

6. The RF MEMS switch according to claim 1, wherein a distance between the movable electrode and the second electrode is 4.0 µm to 4.5 µm.

7. The RF MEMS switch according to claim 1, further comprising:
    a third electrode, disposed on the substrate and in the second insulating layer; and
    a first interconnect structure, disposed in the second insulating layer and coupled to the movable electrode and the third electrode.

8. The RF MEMS switch according to claim 1, wherein a material of the first electrode comprises doped polysilicon.

9. The RF MEMS switch according to claim 1, wherein a material of the first insulating layer comprises a high-temperature oxide.

10. The RF MEMS switch according to claim 1, wherein a thickness of the first insulating layer is 30 nm to 40 nm.

11. The RF MEMS switch according to claim 1, wherein when a fifth bias is applied to the first electrode and a sixth bias is applied to the movable electrode, the movable portion and the first electrode form a third capacitor.

12. The RF MEMS switch according to claim 1, wherein when a seventh bias is applied to the second electrode and the fourth electrode and an eighth bias is applied to the movable electrode, the movable portion, the second electrode and the fourth electrode form a fourth capacitor.

13. The RF MEMS switch according to claim 1, further comprising:
    a fifth electrode, disposed on the substrate and in the second insulating layer; and
    a second interconnect structure, disposed in the second insulating layer and coupled to the movable electrode and the fifth electrode.

14. The RF MEMS switch according to claim 1, wherein a distance between the movable electrode and the first insulating layer is 2.8 µm to 3.0 µm.

* * * * *